US012667004B2

(12) United States Patent
Sun et al.

(10) Patent No.: US 12,667,004 B2
(45) Date of Patent: Jun. 23, 2026

(54) SEMICONDUCTOR PACKAGE

(71) Applicant: CHANGXIN MEMORY TECHNOLOGIES, INC., Hefei City (CN)

(72) Inventors: Xiaofei Sun, Hefei City (CN); Changhao Quan, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 881 days.

(21) Appl. No.: 17/935,068

(22) Filed: Sep. 23, 2022

(65) Prior Publication Data

US 2023/0014834 A1      Jan. 19, 2023

Related U.S. Application Data

(63) Continuation of application No. PCT/CN2022/110286, filed on Aug. 4, 2022.

(30) Foreign Application Priority Data

Jul. 8, 2022     (CN) .......................... 202210806565.3

(51) Int. Cl.
    *H10W 90/00*          (2026.01)
    *H10W 70/65*          (2026.01)
            (Continued)

(52) U.S. Cl.
    CPC ........... *H10W 90/00* (2026.01); *H10W 70/65* (2026.01); *H10W 70/685* (2026.01);
            (Continued)

(58) Field of Classification Search
    CPC ............. H01L 25/105; H01L 23/49816; H01L 23/49822; H10W 90/701; H10W 90/00; H10W 90/401
    See application file for complete search history.

(56) References Cited

U.S. PATENT DOCUMENTS 7,026,709 B2     4/2006  Tsai et al.
7,354,800 B2     4/2008  Carson
            (Continued)

FOREIGN PATENT DOCUMENTS

CN          1731917 A      2/2006
CN       101075596 A      11/2007
            (Continued)

OTHER PUBLICATIONS

KR first office action in application No. 10-2022-7040844 mailed on Mar. 29, 2024 (with English translation).
            (Continued)

*Primary Examiner* — Errol V Fernandes
(74) *Attorney, Agent, or Firm* — Syncoda LLC; Feng Ma

(57) ABSTRACT

A semiconductor package includes a first base plate, first semiconductor structure, second base plate and filling layer. The first base plate has a first surface including first and second signal transmission regions. The first semiconductor structure located on the first surface is electrically connected to the first signal transmission region. The second base plate located on the first base plate includes a base and a first interconnection surface. The first interconnection surface is away from the first surface. The first interconnection surface has first and second interconnection regions communicated with each other. The first interconnection region is electrically connected to the second signal transmission region. The filling layer seals the first semiconductor structure, second base plate and first surface. The first interconnection region is not sealed, and the second interconnection region is. There is a preset height between a top surface of the filling layer and the first interconnection region.

19 Claims, 14 Drawing Sheets

(51) Int. Cl.

| | |
|---|---|
| *H10W 70/685* | (2026.01) |
| *H10W 70/60* | (2026.01) |
| *H10W 72/00* | (2026.01) |
| *H10W 72/50* | (2026.01) |
| *H10W 74/00* | (2026.01) |
| *H10W 90/20* | (2026.01) |

(52) U.S. Cl.
CPC ....... *H10W 90/401* (2026.01); *H10W 90/701* (2026.01); *H10W 70/60* (2026.01); *H10W 72/5366* (2026.01); *H10W 72/865* (2026.01); *H10W 72/877* (2026.01); *H10W 72/884* (2026.01); *H10W 74/00* (2026.01); *H10W 90/291* (2026.01); *H10W 90/722* (2026.01); *H10W 90/724* (2026.01); *H10W 90/732* (2026.01); *H10W 90/734* (2026.01); *H10W 90/754* (2026.01)

(56) References Cited

U.S. PATENT DOCUMENTS

| | | | |
|---|---|---|---|
| 7,723,159 B2 | 5/2010 | Do | |
| 7,800,211 B2 | 9/2010 | Yang et al. | |
| 7,927,917 B2 | 4/2011 | Pagaila et al. | |
| 8,198,735 B2 | 6/2012 | Chow | |
| 8,227,925 B2 | 7/2012 | Song et al. | |
| 8,309,397 B2 | 11/2012 | Shim | |
| 8,699,232 B2 | 4/2014 | Choi | |
| 8,962,393 B2 | 2/2015 | Pagaila | |
| 9,595,509 B1 | 3/2017 | Yap | |
| 10,410,968 B2 | 9/2019 | Park | |
| 11,211,334 B2 | 12/2021 | Lin et al. | |
| 2003/0219969 A1 | 11/2003 | Saito et al. | |
| 2004/0145039 A1 | 7/2004 | Shim et al. | |
| 2005/0023657 A1 | 2/2005 | Tsai et al. | |
| 2006/0244157 A1* | 11/2006 | Carson | H01L 25/0652 |
| | | | 257/E25.023 |
| 2008/0157325 A1 | 7/2008 | Chow | |
| 2008/0227238 A1 | 9/2008 | Ko et al. | |
| 2009/0001540 A1 | 1/2009 | Yang et al. | |
| 2009/0079091 A1 | 3/2009 | Song et al. | |
| 2009/0085225 A1 | 4/2009 | Park | |
| 2009/0091015 A1 | 4/2009 | Shen et al. | |
| 2009/0236718 A1 | 9/2009 | Yang | |
| 2009/0243068 A1 | 10/2009 | Kuan et al. | |
| 2010/0046183 A1 | 2/2010 | Park et al. | |
| 2010/0072593 A1 | 3/2010 | Kim et al. | |
| 2010/0148354 A1 | 6/2010 | Choi et al. | |
| 2010/0244221 A1 | 9/2010 | Ko et al. | |
| 2010/0258930 A1 | 10/2010 | Oh | |
| 2010/0320582 A1 | 12/2010 | Pagaila et al. | |
| 2011/0062591 A1 | 3/2011 | Choi et al. | |
| 2011/0127662 A1 | 6/2011 | Yang et al. | |
| 2011/0133325 A1 | 6/2011 | Moon | |
| 2011/0193205 A1 | 8/2011 | Hsieh | |
| 2012/0146243 A1 | 6/2012 | Song et al. | |
| 2012/0217645 A1 | 8/2012 | Pagaila | |
| 2012/0319267 A1 | 12/2012 | Moon et al. | |
| 2013/0075889 A1 | 3/2013 | Pagaila et al. | |
| 2014/0103527 A1 | 4/2014 | Marimuthu et al. | |
| 2014/0291821 A1 | 10/2014 | Song | |
| 2015/0102506 A1 | 4/2015 | Song et al. | |
| 2015/0115466 A1 | 4/2015 | Kim | |
| 2015/0270232 A1 | 9/2015 | Chen | |
| 2016/0172337 A1 | 6/2016 | Kim | |
| 2016/0343691 A1 | 11/2016 | Chen et al. | |
| 2017/0069607 A1 | 3/2017 | Yap | |
| 2017/0141043 A1 | 5/2017 | Park | |
| 2017/0228529 A1 | 8/2017 | Huang et al. | |
| 2018/0005974 A1 | 1/2018 | Chiu et al. | |
| 2019/0013299 A1 | 1/2019 | Lee | |
| 2019/0252772 A1 | 8/2019 | Ndip et al. | |
| 2019/0296002 A1 | 9/2019 | Pei et al. | |
| 2019/0378826 A1 | 12/2019 | Kim | |

| | | | |
|---|---|---|---|
| 2020/0020637 A1 | 1/2020 | Kim et al. | |
| 2020/0066663 A1 | 2/2020 | Aleksov et al. | |
| 2020/0194331 A1 | 6/2020 | Kim et al. | |
| 2020/0312783 A1 | 10/2020 | Min et al. | |
| 2020/0381406 A1 | 12/2020 | Dominguez et al. | |
| 2021/0035895 A1 | 2/2021 | Oh et al. | |
| 2021/0035913 A1 | 2/2021 | Park et al. | |
| 2021/0050294 A1 | 2/2021 | Tsai et al. | |
| 2021/0343617 A1 | 11/2021 | Kim et al. | |
| 2021/0351172 A1 | 11/2021 | Pei et al. | |
| 2022/0122896 A1 | 4/2022 | Wang et al. | |
| 2022/0130764 A1 | 4/2022 | Lin et al. | |
| 2022/0199549 A1 | 6/2022 | Min et al. | |
| 2022/0199593 A1 | 6/2022 | Yang et al. | |
| 2023/0052194 A1 | 2/2023 | Kim | |

FOREIGN PATENT DOCUMENTS

| | | |
|---|---|---|
| CN | 103219296 A | 7/2013 |
| CN | 204102862 U | 1/2015 |
| CN | 104576557 A | 4/2015 |
| CN | 105161435 A | 12/2015 |
| CN | 103219296 B | 4/2016 |
| CN | 106711094 A | 5/2017 |
| CN | 107527877 A | 12/2017 |
| CN | 104576557 B | 8/2018 |
| CN | 110581121 A | 12/2019 |
| CN | 110718528 A | 1/2020 |
| CN | 110797325 A | 2/2020 |
| CN | 111819689 A | 10/2020 |
| CN | 113113318 A | 7/2021 |
| CN | 114664761 A | 6/2022 |
| EP | 3258486 A1 | 12/2017 |
| EP | 3399548 A1 | 11/2018 |
| JP | S60160645 A | 8/1985 |
| JP | 2002217331 A | 8/2002 |
| JP | 2004172157 A | 6/2004 |
| JP | 2005026680 A | 1/2005 |
| JP | 2010212605 A | 9/2010 |
| JP | 2010278318 A | 12/2010 |
| JP | 2011233672 A | 11/2011 |
| KR | 100890073 B1 | 3/2009 |
| KR | 20090091486 A | 8/2009 |
| KR | 20090091487 A | 8/2009 |
| KR | 20170094483 A | 8/2017 |
| KR | 20180004658 A | 1/2018 |
| KR | 20190093194 A | 8/2019 |
| KR | 20210016216 A | 2/2021 |
| TW | 200950132 A | 12/2009 |
| TW | 201128748 A | 8/2011 |
| TW | 201314812 A | 4/2013 |
| TW | 201415586 A | 4/2014 |
| TW | 201532234 A | 8/2015 |
| TW | 201620102 A | 6/2016 |
| TW | 202042355 A | 11/2020 |
| TW | 202044520 A | 12/2020 |
| TW | 202101685 A | 1/2021 |
| TW | 202109800 A | 3/2021 |
| TW | 202121513 A | 6/2021 |
| TW | 202125725 A | 7/2021 |
| TW | 202129904 A | 8/2021 |
| TW | 202209581 A | 3/2022 |
| TW | M627599 U | 6/2022 |

OTHER PUBLICATIONS

KR first office action in application No. 10-2022-7041847 mailed on Mar. 29, 2024 (with English translation).
European patent office action in application No. 22783274.8, mailed on Feb. 16, 2024.
SG search report and written opinion in application No. 11202254069A, mailed on Jun. 26, 2025.
JP first office action in application No. 2022-566266, mailed on Oct. 8, 2024.
JP first office action in application No. 2022-562587, mailed on Oct. 15, 2024.
JP first office action in application No. 2022-563494, mailed on Oct. 1, 2024.

(56) References Cited

OTHER PUBLICATIONS

US non-final office action in U.S. Appl. No. 18/152,188, mailed on May 20, 2025.
First Office Action of the Taiwanese application No. 111131908, issued on Jul. 31, 2023. 6 pages with English abstract.
JP first office action in application No. 2022-562492, mailed on Sep. 3, 2024.
US office action in U.S. Appl. No. 17/951,722, mailed on Jun. 11, 2025.
US office action in U.S. Appl. No. 18/154,739, mailed on Feb. 5, 2026.
US office action in U.S. Appl. No. 17/952,404, mailed on Sep. 23, 2025.
US office action in U.S. Appl. No. 18/166,465, mailed on Oct. 2, 2025.
European office action in application No. 22793375, mailed on Oct. 15, 2025.

* cited by examiner

SEMICONDUCTOR PACKAGE

CROSS-REFERENCE TO RELATED APPLICATIONS

The present application is a U.S. continuation application of International Application No. PCT/CN2022/110286 filed on Aug. 4, 2022, which claims priority to Chinese Patent Application No. 202210806565.3 filed on Jul. 8, 2022. The disclosures of the above-referenced applications are hereby incorporated by reference in their entirety.

BACKGROUND

All sectors, industries and regions continually require lighter, faster, smaller, more functional, more reliable and more cost-effective products for the electronics industry. In order to meet these growing requirements of many different consumers, more circuits are required to be integrated to provide required functions. In almost all applications, there is a growing requirement for reducing sizes, enhancing performance and improving the functions of the integrated circuits.

SUMMARY

In view of this, an embodiment of the disclosure provides a semiconductor package.

A first aspect of the embodiments of the disclosure provides a semiconductor package, including a first base plate, a first semiconductor structure, a second base plate and a filling layer.

The first base plate has a first surface. The first surface includes a first signal transmission region and a second signal transmission region.

The first semiconductor structure is located on the first surface of the first base plate and electrically connected to the first signal transmission region.

The second base plate is located on the first base plate and includes a base and a first interconnection surface located on the base. The first interconnection surface of the second base plate is away from the first surface of the first base plate. The first interconnection surface has a first interconnection region and a second interconnection region that communicate with each other. The first interconnection region is electrically connected to the second signal transmission region.

The filling layer seals the first semiconductor structure, the second base plate and the first surface of the first base plate. The first interconnection region is not sealed by the filling layer, and the second interconnection region is sealed by the filling layer. There is a preset height between a top surface of the filling layer on the second interconnection region and the first interconnection region.

BRIEF DESCRIPTION OF THE DRAWINGS

In order to more clearly illustrate the technical solutions in the embodiments of the disclosure or conventional technologies, the drawings used in the technical description of the embodiments will be briefly described below. It is apparent that the drawings in the following descriptions are merely some embodiments of the disclosure. Other drawings can be obtained from those skilled in the art according to these drawings without any creative work.

DETAILED DESCRIPTION

Figure 1:
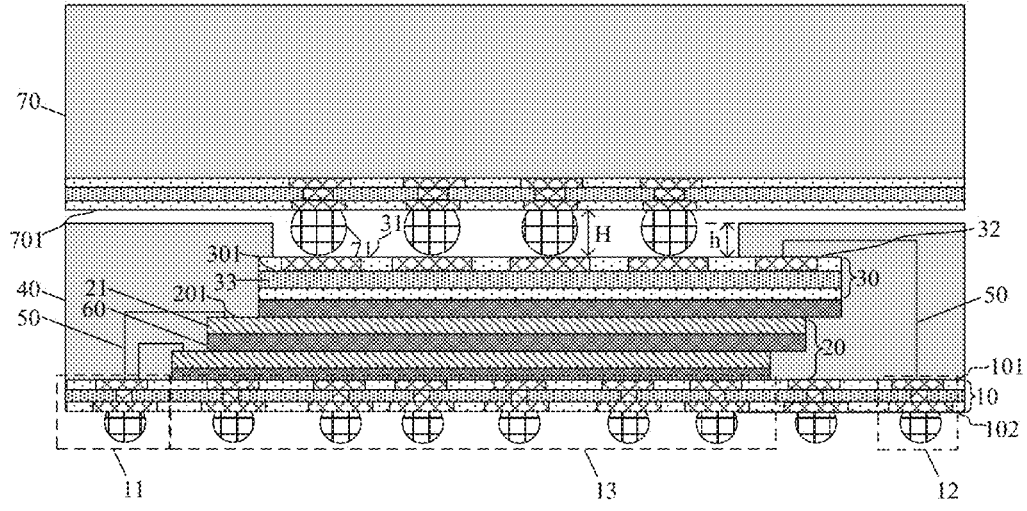
FIG. 1 is a schematic structural diagram of a semiconductor package according to an embodiment of the disclosure.

The disclosure relates to the technical field of semiconductors, and in particular, to a semiconductor package.

Exemplary embodiments disclosed in the disclosure are described in more detail with reference to drawings. Although the exemplary embodiments of the disclosure are shown in the drawings, it should be understood that the disclosure may be implemented in various forms and should not be limited by the specific embodiments described here. On the contrary, these embodiments are provided for more thorough understanding of the disclosure, and to fully convey a scope disclosed in the embodiments of the disclosure to a person skilled in the art.

In the following descriptions, a lot of specific details are given in order to provide the more thorough understanding of the disclosure. However, it is apparent to a person skilled in the art that the disclosure may be implemented without one or more of these details. In other examples, in order to avoid confusion with the disclosure, some technical features well-known in the field are not described. Namely, all the features of the actual embodiments are not described here, and well-known functions and structures are not described in detail.

In the drawings, the sizes of a layer, a region, and an element and their relative sizes may be exaggerated for clarity. The same reference sign represents the same element throughout.

It should be understood that while the element or the layer is referred to as being "on", "adjacent to", "connected to" or "coupled to" other elements or layers, it may be directly on the other elements or layers, adjacent to, connected or coupled to the other elements or layers, or an intermediate element or layer may be existent. In contrast, while the element is referred to as being "directly on", "directly adjacent to", "directly connected to" or "directly coupled to" other elements or layers, the intermediate element or layer is not existent. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily existent in the disclosure.

Spatial relation terms, such as "under", "below", "lower", "underneath", "above", "upper" and the like, may be used here for conveniently describing so that a relationship between one element or feature shown in the drawings and other elements or features is described. It should be understood that in addition to orientations shown in the drawings, the spatial relationship terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below" and "under" may include two orientations of up and down. The device may be otherwise oriented (rotated by 90 degrees or other orientations) and the spatial descriptions used here are interpreted accordingly.

A purpose of the terms used here is only to describe the specific embodiments and not as limitation to the disclosure. While used here, singular forms of "a", "an" and "said/the" are also intended to include plural forms, unless the context clearly indicates another mode. It should also be understood that terms "composition" and/or "including", while used in the description, determine the existence of the described features, integers, steps, operations, elements and/or components, but do not exclude the existence or addition of one or more other features, integers, steps, operations, elements, components, and/or groups. As used herein, a term "and/or" includes any and all combinations of related items listed.

In order to understand the disclosure thoroughly, detailed steps and detailed structures are presented in the following description, so as to explain the technical solutions of the disclosure. Preferred embodiments of the disclosure are described in detail below; however, the disclosure may also have other implementations in addition to these detailed descriptions.

A current semiconductor package technology generally uses a discrete method or a UFS Multi Chip Package (UMCP) method. The discrete method is, for example, to distribute a DRAM chip and an NAND chip for package. The UMCP is, for example, to package a memory chip and a control chip in the same package structure. Packaging by means of the discrete method causes the package structure to occupy a large area of a PCB, and the UMCP method may cause difficult test and failure analysis and poor heat dissipation of a controller. In addition, chips of different capacities cannot be flexibly combined.

Based on this, embodiments of the disclosure provide a semiconductor package. FIG. 1 is a schematic structural diagram of a semiconductor package according to an embodiment of the disclosure.

Referring to FIG. 1, the semiconductor package includes a first base plate 10, a first semiconductor structure 20, a second base plate 30 and a filling layer 40.

The first base plate 10 has a first surface 101. The first surface 101 includes a first signal transmission region 11 and a second signal transmission region 12.

The first semiconductor structure 20 is located on the first surface 101 of the first base plate 10 and electrically connected to the first signal transmission region 11.

The second base plate 30 is located above the first base plate 10 and includes a base 33 and a first interconnection surface 301 located on the base 33. The first interconnection surface 301 of the second base plate 30 is away from the first surface 101 of the first base plate 10. The first interconnection surface 301 has a first interconnection region 31 and a second interconnection region 32 that communicate with each other. The first interconnection region 31 is electrically connected to the second signal transmission region 12.

The filling layer 40 seals the first semiconductor structure 20, the second base plate 30 and the first surface 101 of the first base plate 10. The first interconnection region 31 is not sealed by the filling layer 40, and the second interconnection region 32 is sealed by the filling layer 40. There is a preset height h between a top surface of the filling layer 40 on the second interconnection region 32 and the first interconnection region 31.

Through the arrangement of the second base plate, subsequent other semiconductor structures can be connected to the first semiconductor structure and the first base plate by the first interconnection region on the second base plate. By doing so, the connection among the semiconductor structures of different types or different specifications can be realized, a combination among different semiconductor structures can be more flexible. In addition, since the first semiconductor structure and subsequent other semiconductor structures connected to the first semiconductor structure are packaged independently, test and failure analysis are easier to perform. Since there is the preset height between the first interconnection region of the second base plate and the top surface of the filling layer, other semiconductor structures may be placed on the first interconnection region, within a region enclosed by the filling layer, so that the height and size of the entire structure can be reduced.

Figure 2:
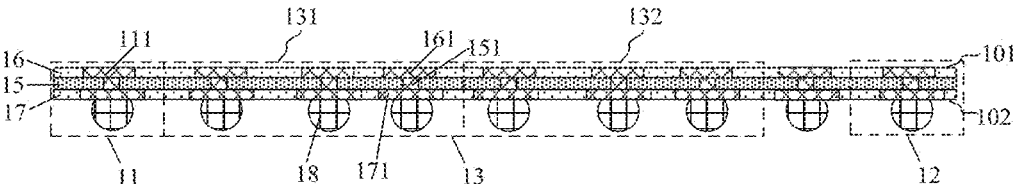
FIG. 2 is a schematic structural diagram of a first base plate according to an embodiment of the disclosure.

FIG. 2 is a schematic structural diagram of a first base plate according to an embodiment of the disclosure.

In some embodiments, the first base plate 10 may be a Printed Circuit Board (PCB) or a redistribution base plate.

As shown in FIG. 2, the first base plate 10 includes a first base 15, and a first upper insulating dielectric layer 16 and a first lower insulating dielectric layer 17 that are respectively located on an upper surface and lower surface of the first base 15.

The first base 15 may be a silicon substrate, a germanium substrate, a silicon germanium substrate, a silicon carbide substrate, a Silicon On Insulator (SOI) substrate, or a Germanium On Insulator (GOI) substrate, or may be a substrate including other element semiconductors or compound semiconductors, such as a glass substrate or a III-V compound substrates (for example, a gallium nitride substrate or a gallium arsenide substrate), or may be a laminated structure such as Si/SiGe, or may be other epitaxial structures such as Silicon Germanium On Insulator (SGOI).

The first upper insulating dielectric layer 16 and the first lower insulating dielectric layer 17 may be solder mask layers. For example, materials of the first upper insulating dielectric layer 16 and the first lower insulating dielectric layer 17 may be green paint.

In an embodiment, the first base plate 10 has a second surface 102 facing away from the first surface 101. There are circuit channels 151 between the first surface 101 and the second surface 102. The second surface 102 of the first base plate 10 has a plurality of first connection pads 171.

The first surface of the first base plate 10 has a plurality of sixth connection pads 161. The circuit channel 151 connects the sixth connection pad 161 and the first connection pad 171.

In an embodiment, the first signal transmission region 11 of the first base plate 10 has a plurality of fourth connection pads 111. An area of the fourth connection pad 111 is less than or equal to the area of the first connection pad 171. In this embodiment, by means of the design that the area of the fourth connection pad 111 is less than the area of the first connection pad 171, more efficient signal transmission efficiency between the first semiconductor structure 20 and the first signal transmission region 11 of the first base plate 10 can be achieved, and a chip area can be reduced. In addition, by means of the design that the area of the first connection pad 171 is greater than that of the fourth connection pad 111, the conductive efficiency and heat conduction efficiency between the first semiconductor structure 20 and the first base plate 10 can be enhanced. The first signal transmission region of the first base plate 10 is electrically connected to the second surface.

The first connection pad 171 of the first base plate 10 has a second contact structure 18 protruding from the first base plate 10.

The second contact structure 18 may electrically connect the semiconductor package to an external apparatus, so that at least one of a control signal, a power signal or a grounding signal that are used to operate the first semiconductor structure may be received from the external apparatus, or a data signal to be stored in the first semiconductor structure may be received from the external apparatus. Alternatively, data in the first semiconductor structure may also be provided to the external apparatus.

The second contact structure 18 includes a conductive material. In this embodiment of the disclosure, the second contact structure 18 is a solder ball. It is understandable that, a shape of the second contact structure provided in the embodiments of the disclosure is only a specific and feasible implementation in the embodiments of the disclosure, and does not constitute a limitation of the disclosure. The second contact structure may also be a structure with other shapes. The number, spacing, and location of the second contact structures are not limited to any specific arrangement, and various modifications may be made.

The first surface 101 of the first base plate 10 includes a first signal transmission region 11 and a second signal transmission region 12. The first signal transmission region 11 is electrically connected to the first semiconductor structure 20. The second signal transmission region 12 is electrically connected to the second base plate 30.

In an embodiment, the first signal transmission region 11 and the second signal transmission region 12 are not connected to each other.

In an embodiment, the first surface 101 of the first base plate 10 further includes a third signal transmission region

13 located between the first signal transmission region 11 and the second signal transmission region 12. The first semiconductor structure 20 is located on the third signal transmission region 13. In this embodiment, by disposing the first semiconductor structure 20 right above the third signal transmission region 13, the first signal transmission region 11 is located outside the first semiconductor structure 20, so that the connection stability between the first signal transmission region 11 and the first semiconductor structure 20 can be increased.

In an embodiment, an area of a distribution region of the first signal transmission region 11 on the first base plate 10 may be less than an area of a distribution region of the third signal transmission region 13 on the first base plate 10, so that a lateral dimension of a first package can be decreased, and an integration level can be enhanced.

The first semiconductor structure 20 includes a plurality of first semiconductor chips 21 that are successively stacked in a direction perpendicular to the first base plate 10. In this embodiment, by means of successively stacking the plurality of first semiconductor chips upwards, a horizontal area of the semiconductor package can be saved. The first semiconductor chip may be a DRAM chip.

In an embodiment, as shown in FIG. 1 and FIG. 2, the second base plate 30 is located on the first semiconductor structure 20. The first interconnection region 31 is electrically connected to the second signal transmission region 12 by means of the second interconnection region 32. The third signal transmission region 13 includes a first signal sub-region 131 and a second signal sub-region 132. The first signal sub-region 131 is connected to the first signal transmission region 11 and located in a close region of the first signal transmission region 11. The second signal sub-region 132 is connected to the second signal transmission region 12 and located in a close region of the second signal transmission region 12.

In an embodiment, the first signal sub-region 131 and the second signal sub-region 132 are not connected to each other.

In an embodiment, there is an electromagnetic shielding structure (not shown) between the first signal sub-region 131 and the second signal sub-region 132 of the first base plate 10.

Since the first signal sub-region 131 is connected to the first signal transmission region 11, the second signal sub-region 132 is connected to the second signal transmission region, the first signal transmission region is connected to the first semiconductor structure, and the second signal transmission region is indirectly connected to a second package by being connected to the second base plate, by disposing the electromagnetic shielding structure between the first signal sub-region and the second signal sub-region, signal interference between the first semiconductor structure and the second package can be prevented.

Figure 3:
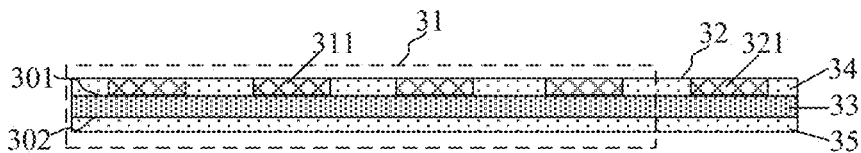
FIG. 3 is a schematic structural diagram of a second base plate according to an embodiment of the disclosure.

FIG. 3 is a schematic structural diagram of a second base plate according to an embodiment of the disclosure.

As shown in FIG. 3, the second base plate 30 includes a base 33, and an upper insulating dielectric layer 34 and a lower insulating dielectric layer 35 that are respectively located on an upper surface and lower surface of the base 33.

The base 33 may be a silicon substrate, a germanium substrate, a silicon germanium substrate, a silicon carbide substrate, an SOI substrate, or a GOI substrate, or may be a substrate including other element semiconductors or compound semiconductors, such as a glass substrate or a III-V compound substrates (for example, a gallium nitride substrate or a gallium arsenide substrate), or may be a laminated structure such as Si/SiGe, or may be other epitaxial structures such as SGOI.

The upper insulating dielectric layer 34 and the lower insulating dielectric layer 35 may be solder mask layers. For example, materials of the upper insulating dielectric layer 34 and the lower insulating dielectric layer 35 may be green paint.

The first interconnection region 31 of the second base plate 30 has a plurality of second connection pads 311. An area of the second connection pad 311 is greater than or equal to an area of the first connection pad 171.

By setting the area of the second connection pad 311 to a larger area, a contact area when the second package is in contact with the second connection pad 311 can be enlarged. If the contact area is relatively small, it is very difficult to dismount after soldering, so that more convenient follow-up disassembly and reassembly can be realized by enlarging the contact area.

In an embodiment, the second interconnection region 32 of the second base plate 30 has a plurality of third connection pads 321. An area of the third connection pad 321 is less than the area of the second connection pad 311.

The number of the third connection pads 321 is greater than the number of the second connection pads 311.

Since the second connection pad is required to be mated and connected to the second package subsequently, the layout design is relatively fixed. The third connection pad carries the interconnection between the second package and the first base plate, so that the layout design is more flexible. By designing the third connection pad to have a larger number and a smaller area, the signal transmission efficiency can be enhanced, and the integration level of the first package can be increased.

In an embodiment, the base 33 of the second base plate 30 has an electromagnetic shielding layer (not shown). By disposing the electromagnetic shielding layer in the base of the second base plate, information interference between the second package and the first semiconductor structure can be prevented from affecting the operation of devices.

Figure 4:
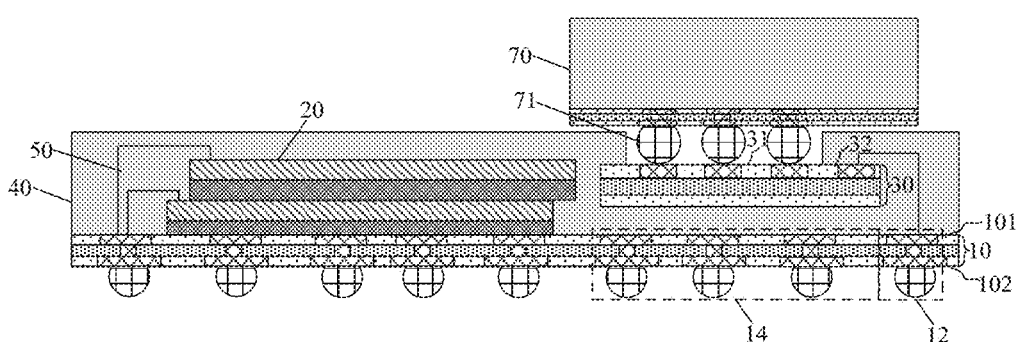
FIG. 4 is another example of a semiconductor package according to an embodiment of the disclosure.

FIG. 4 is a schematic structural diagram of a semiconductor package according to another embodiment of the disclosure.

As shown in FIG. 4, in this embodiment, the second base plate 30 is not located above the first semiconductor structure 20, but directly located on the first base plate 10.

In an embodiment, the first surface 101 of the first base plate 10 further includes a fourth signal transmission region 14. The second base plate 30 is located on the fourth signal transmission region 14. The second signal transmission region 12 is electrically connected to the fourth signal transmission region 14.

In an embodiment, the fourth signal transmission region 14 is electrically connected to the first interconnection region 31.

In an embodiment, the fourth signal transmission region 14 and the first signal transmission region 11 are not connected to each other.

Specifically, the first interconnection region 31 is electrically connected to the second signal transmission region 12 by means of the second interconnection region 32, and the second signal transmission region 12 is electrically connected to the fourth signal transmission region 14, so that the fourth signal transmission region 14 is electrically connected to the first interconnection region by means of the second signal transmission region 12 and the second interconnection region 32.

In this embodiment of the disclosure, the manner of electrically connecting the first semiconductor structure 20 and the second base plate 30 with the first base plate 10 includes wire bonding and Through-Silicon-Via (TSV) interconnection.

Referring to FIG. 1, the first semiconductor structure 20 and the second base plate 30 are electrically connected to the first base plate 10 by means of wire bonding.

The first signal transmission region 11 and the second signal transmission region 12 are located at two opposite sides of the first base plate 10. The first semiconductor structure 20 has a first connection end 201. The first connection end 201 and the first signal transmission region 11 are located at the same side and connected to each other by using a lead wire 50. The second interconnection region 32 and the second signal transmission region 12 are located at the same side and connected to each other by using a lead wire 50.

The wire bonding manner of electrically connecting the first semiconductor structure 20 with the first base plate 10 includes a hanging manner and a Film On Wire (FOW) manner.

In the embodiment shown in FIG. 1, wire bonding is performed by means of the hanging manner. The two adjacent first semiconductor chips 21 are connected to each other by means of an adhesive film 60. The adhesive film 60 does not cover the first connection end 201 and the lead wire 50 at the first semiconductor chip 21 at a layer below the adhesive film. The adhesive film is misaligned with the first semiconductor chip 21 at the layer below the adhesive film.

In some other embodiments, wire bonding is performed by means of the FOW manner (not shown). The plurality of first semiconductor chips are aligned along a direction perpendicular to the first base plate). The adhesive film between the two adjacent first semiconductor chips covers the first connection end and the lead wire at the first semiconductor chip at the layer below the adhesive film.

Figure 5:
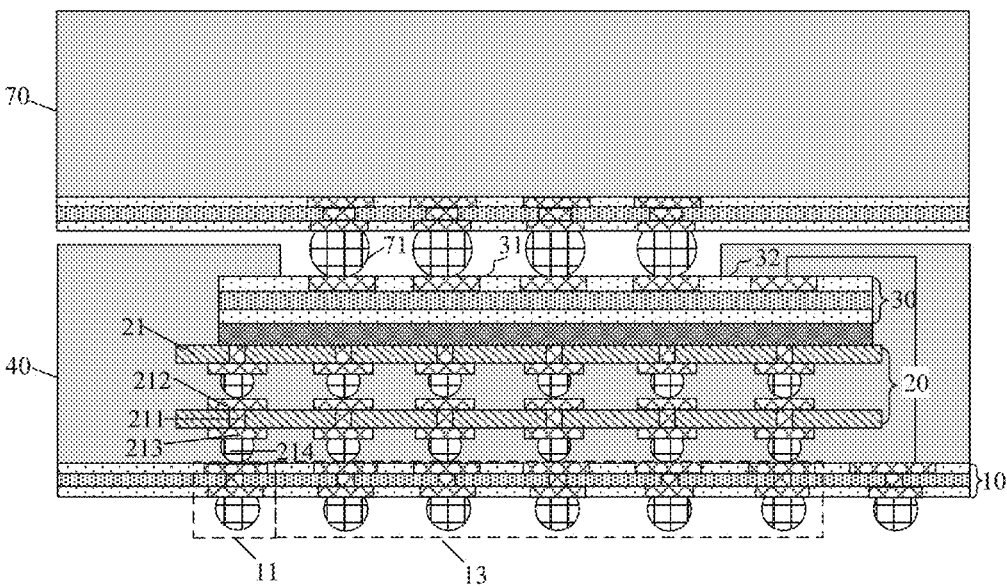
FIG. 5 is still another example of a semiconductor package according to an embodiment of the disclosure.
Figure 6:
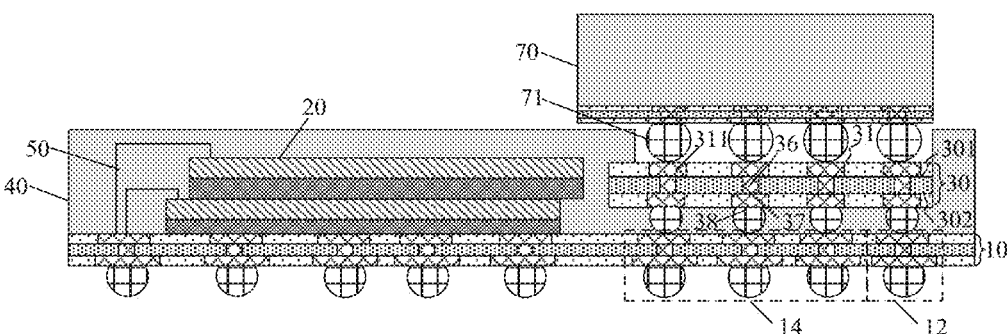
FIG. 6 is yet another example of a semiconductor package according to an embodiment of the disclosure.

In other embodiments, referring to FIG. 5 and FIG. 6, the first semiconductor structure 20 is electrically connected to the first base plate 10 by means of TSV interconnection.

As shown in FIG. 5, the first semiconductor chip 21 includes a first chip connection pad 212 and a second chip connection pad 213 that are respectively located on the upper surface and the lower surface, and a first channel 211 that penetrates the first semiconductor chip 21 and connects the first chip connection pad 212 and the second chip connection pad 213. The first channel 211 includes a TSV.

Electric connections between the two adjacent first semiconductor chips 21 and between the first semiconductor structure 20 and the first base plate 10 are achieved by means of the first chip connection pad 212, the second chip connection pad 213, the first channel 211 and a first solder ball 214.

The first semiconductor structure 20 is connected to the first signal transmission region 11 in the direction perpendicular to the first base plate 10.

The first semiconductor structure 20 is connected to the third signal transmission region 13 in the direction perpendicular to the first base plate 10. The first signal transmission region 11 is connected to the third signal transmission region 13.

In this embodiment, since the first semiconductor structure is electrically connected to the first base plate by means of TSV interconnection, wire bonding is not required, so that the first signal transmission region and the third signal transmission region can be merged into one region.

As shown in FIG. 6, the second base plate 30 further includes a second interconnection surface 302 located on the other surface of the base 33. The base 33 has a channel 36 that connects the first interconnection region 31 and the second interconnection surface 302. The first interconnection region 31 is connected to the second signal transmission region 12 by means of the channel 36 in the direction perpendicular to the first base plate 10.

The second base plate 30 includes a second connection pad 311 located in the first interconnection region 31, a fifth connection pad 37 located at the second interconnection surface 302 of the second base plate 30, and the channel 36 that penetrates the base 33 and connects the second connection pad 311 and the fifth connection pad 37. The channel 36 includes a TSV. There is also a second solder ball 38 between the second base plate 30 and the first base plate 10.

The second base plate 30 is electrically connected to the first base plate 10 by means of the second connection pad 311, the channel 36, the fifth connection pad 37 and the second solder ball 38.

In this embodiment, since the second base plate is electrically connected to the first base plate by means of TSV interconnection, wire bonding is not required, so that the second signal transmission region and the fourth signal transmission region can be merged into one region.

In an embodiment, in the direction perpendicular to the first base plate 10, the first base plate 10 has a first thickness. In a direction perpendicular to the second base plate 30, the second base plate 30 has a second thickness. The first thickness is less than the second thickness. Through such configuration, when the filling layer seals the first base plate and the second base plate, the warping of the second base plate 30 due to a difference between sizes of the first base plate 10 and the second base plate 30 can be prevented from affecting a sealing effect.

In an embodiment, the semiconductor package further includes a second package 70. The second package 70 has a contact surface 701. The second package 70 is connected to the first interconnection region 31 by means of the contact surface 701.

The contact surface 701 of the second package 70 has a first contact structure 71. The first contact structure 71 has, in a direction perpendicular to the contact surface 701, a first height H protruding from the contact surface 701. The first height H is greater than the preset height h.

In this embodiment of the disclosure, by designing the first height to be greater than the preset height, the second package can be tightly connected to the second base plate. In addition, after the second package is connected to the second base plate, there can be a gap between the second package and the filling layer. Therefore, the heat dissipation efficiency of a controller can be enhanced, and the impact of heat dissipation on chips can be reduced.

In an embodiment, referring to FIG. 2, the first connection pad 171 of the first base plate 10 has a second contact structure 18 protruding from the first base plate 10. The second contact structure 18 has, in the direction perpendicular to the first base plate 10, a second height protruding from the first base plate 10. The second height is less than or equal to the first height. Through such configuration, the second package using the first contact structure 71 as a support can be bonded to the first package more stably.

In an embodiment, the second package 70 includes a second semiconductor structure (not shown). The type of the second semiconductor structure is the same as or different from the type of the first semiconductor structure 20.

For example, the second semiconductor structure may be a Universal File Store (UFS) chip.

In the semiconductor package provided in the disclosure, the second semiconductor structure in the second package 70 is connected to the second signal transmission region of the first base plate 10 by means of the second base plate 30. The first semiconductor structure 20 is connected to the first signal transmission region of the first base plate 10. In this way, transmission paths of the first semiconductor structure and the second semiconductor structure are distributed in different regions of the first base plate, so that mutual interference between the first semiconductor structure and the second semiconductor structure can be prevented, thereby enhancing the stability of signal transmission.

The semiconductor package provided in the embodiments of the disclosure is applicable to UFS Multi Chip Package (UMCP) of a Package on Package (PoP) structure.

Figure 7:
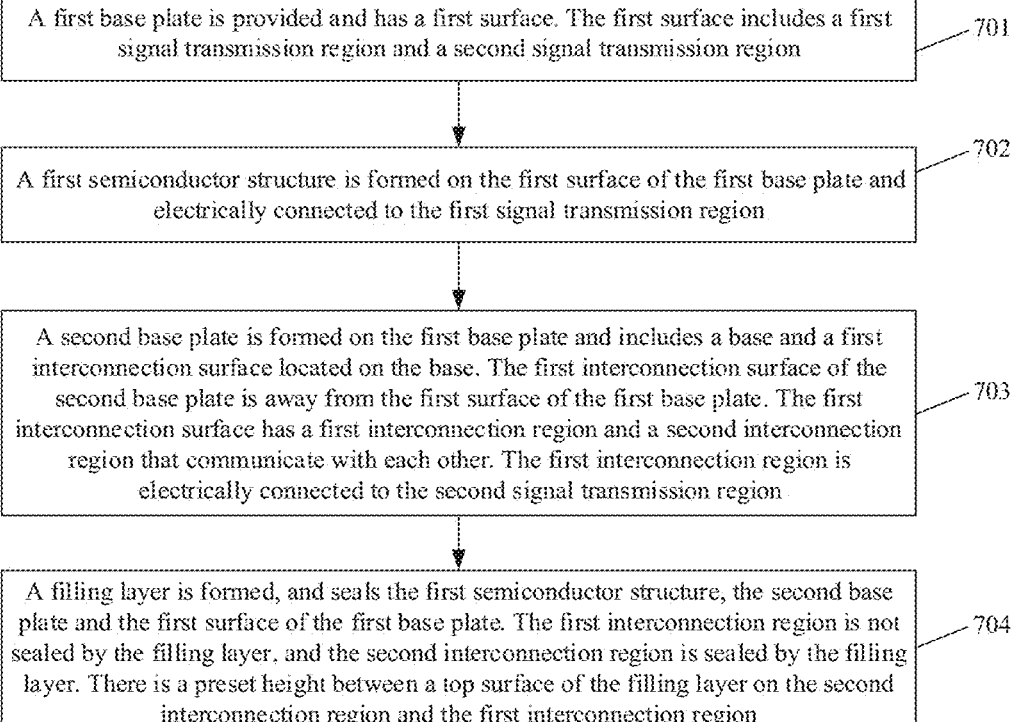
FIG. 7 is a schematic flowchart of a method for manufacturing a semiconductor package according to an embodiment of the disclosure.

Embodiments of the disclosure further provide a method for manufacturing a semiconductor package. Referring to FIG. 7 for details, as shown in the figure, the method includes the following operations.

At S701, a first base plate is provided and has a first surface. The first surface includes a first signal transmission region and a second signal transmission region.

At S702, a first semiconductor structure is formed on the first surface of the first base plate and electrically connected to the first signal transmission region.

At S703, a second base plate is formed on the first base plate and includes a base and a first interconnection surface located on the base. The first interconnection surface of the second base plate is away from the first surface of the first base plate. The first interconnection surface has a first interconnection region and a second interconnection region that communicate with each other. The first interconnection region is electrically connected to the second signal transmission region.

At S704, a filling layer is formed; the filling layer seals the first semiconductor structure, the second base plate and the first surface of the first base plate. The first interconnection region is not sealed by the filling layer, and the second interconnection region is sealed by the filling layer. There is a preset height between a top surface of the filling layer on the second interconnection region and the first interconnection region.

The method for manufacturing a semiconductor package provided in the embodiments of the disclosure is further described in detail below with reference to specific embodiments.

FIG. 8A to FIG. 8G are schematic structural diagrams of a semiconductor package during manufacturing according to an embodiment of the disclosure.

Figure 8A:
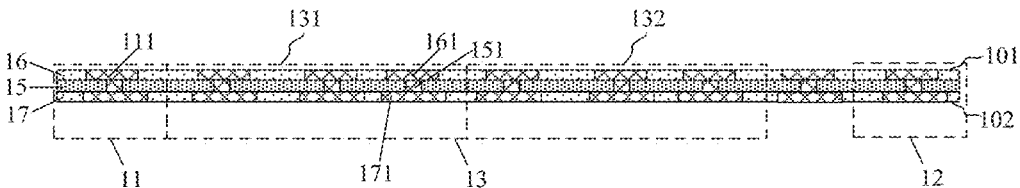
FIG. 8A is a first schematic structural diagram of a semiconductor package during manufacturing according to an embodiment of the disclosure.

Firstly, referring to FIG. 8A, S701 of providing the first base plate 10 is executed. The first base plate 10 has a first surface 101. The first surface 101 includes a first signal transmission region 11 and a second signal transmission region 12.

The first base plate 10 includes a first base 15, and a first upper insulating dielectric layer 16 and a first lower insulating dielectric layer 17 that are respectively located on an upper surface and lower surface of the first base 15.

The first base 15 may be a silicon substrate, a germanium substrate, a silicon germanium substrate, a silicon carbide substrate, a Silicon On Insulator (SOI) substrate, or a Germanium On Insulator (GOI) substrate, or may be a substrate including other element semiconductors or compound semiconductors, such as a glass substrate or a III-V compound substrates (for example, a gallium nitride substrate or a gallium arsenide substrate), or may be a laminated structure such as Si/SiGe, or may be other epitaxial structures such as Silicon Germanium On Insulator (SGOI).

The first upper insulating dielectric layer 16 and the first lower insulating dielectric layer 17 may be solder mask layers. For example, materials of the first upper insulating dielectric layer 16 and the first lower insulating dielectric layer 17 may be green paint.

The first base plate 10 has a second surface 102 facing away from the first surface 101. There is a circuit channel 151 between the first surface 101 and the second surface 102. The second surface 102 of the first base plate 10 has a plurality of first connection pads 171.

The first surface of the first base plate 10 has a plurality of sixth connection pads 161. The circuit channel 151 connects the sixth connection pad 161 and the first connection pad 171.

In an embodiment, the first signal transmission region 11 of the first base plate 10 has a plurality of fourth connection pads 111. An area of the fourth connection pad 111 is less than or equal to the area of the first connection pad 171.

The first surface 101 of the first base plate 10 includes a first signal transmission region 11 and a second signal transmission region 12. The first signal transmission region 11 is electrically connected to the first semiconductor structure 20 formed subsequently. The second signal transmission region 12 is electrically connected to the second base plate 30 formed subsequently.

In an embodiment, the first surface 101 of the first base plate 10 further includes a third signal transmission region 13 located between the first signal transmission region 11 and the second signal transmission region 12. The first semiconductor structure 20 formed subsequently is located on the third signal transmission region 13.

In some other embodiments, for example, as shown in FIG. 4, the first base plate 10 further includes a fourth signal transmission region 14. The second base plate 30 formed subsequently is located on the fourth signal transmission region 14. The second signal transmission region 12 is electrically connected to the fourth signal transmission region 14.

Figure 8B:
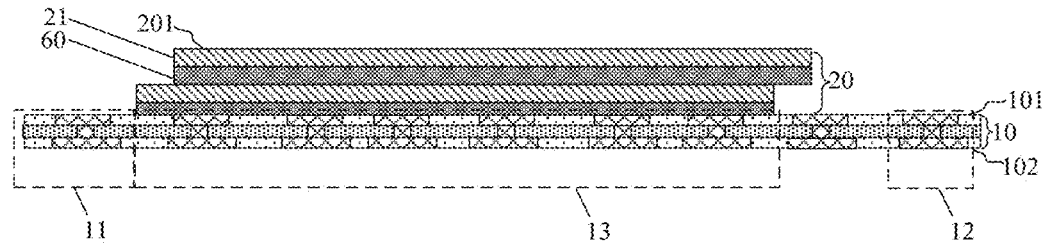
FIG. 8B is a second schematic structural diagram of a semiconductor package during manufacturing according to an embodiment of the disclosure.

Next, referring to FIG. 8B, S702 of forming the first semiconductor structure 20 on the first surface 101 of the first base plate 10 is executed. The first semiconductor structure 20 is electrically connected to the first signal transmission region 11.

The first semiconductor structure 20 includes a plurality of first semiconductor chips 21 that are successively stacked in a direction perpendicular to the first base plate 10.

Two adjacent ones of the first semiconductor chips 21 are connected to each other by means of an adhesive film 60. The first semiconductor structure 20 is also connected to the first base plate 10 by means of the adhesive film 60.

Figure 8C:
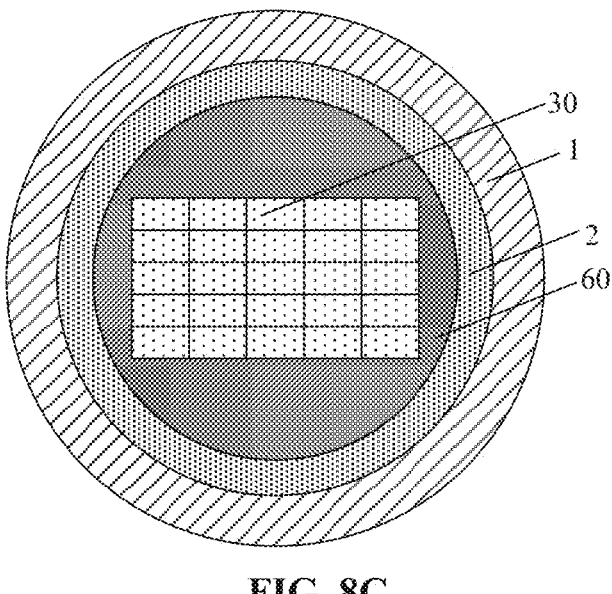
FIG. 8C is a third schematic structural diagram of a semiconductor package during manufacturing according to an embodiment of the disclosure.
Figure 8D:
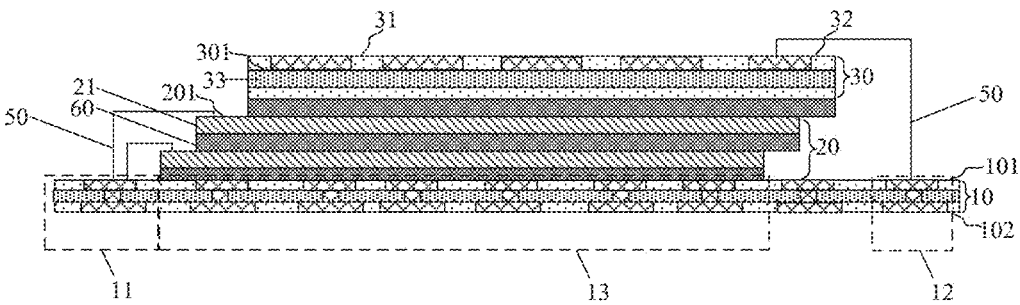
FIG. 8D is a fourth schematic structural diagram of a semiconductor package during manufacturing according to an embodiment of the disclosure.

Next, referring to FIG. 8C and FIG. 8D, S703 of forming the second base plate 30 on the first base plate 10 is executed. The second base plate 30 includes a base 33 and a first interconnection surface 301 located on the base 33. The first interconnection surface 301 of the second base plate 10 is away from the first surface 101 of the first base plate 10. The first interconnection surface 301 has a first interconnection region 31 and a second interconnection region 32 that communicate with each other. The first interconnection region 31 is electrically connected to the second signal transmission region 12.

Specifically, referring to FIG. 8C first, a carrier band 2 is pasted on a circular ring 1. The adhesive film 60 is then pasted on the carrier band 2. Then, the second base plate is pasted on the adhesive film 60. In this case, the second base plate is in an entire strip shape. The second base plate is cut to form units one by one shown in FIG. 8C.

Next, referring to FIG. 8D, the second base plate 30 is formed on the first semiconductor structure 20.

Specifically, an adhesive layer 60 is formed on the first semiconductor structure 20. Then, the single second base plate formed in FIG. 8C is pasted on the first semiconductor structure 20.

In some other embodiments, for example, as shown in FIG. 4, the second base plate 30 is not formed on the first semiconductor structure 20, but directly formed on the first base plate 10.

Referring to FIG. 3, the second base plate 30 includes a base 33, and an upper insulating dielectric layer 34 and a lower insulating dielectric layer 35 that are respectively located on an upper surface and lower surface of the base 33.

The base 33 may be a silicon substrate, a germanium substrate, a silicon germanium substrate, a silicon carbide substrate, an SOI substrate, or a GOI substrate, or may be a substrate including other element semiconductors or compound semiconductors, such as a glass substrate or a III-V compound substrates (for example, a gallium nitride substrate or a gallium arsenide substrate), or may be a laminated structure such as Si/SiGe, or may be other epitaxial structures such as SGOI.

The upper insulating dielectric layer 34 and the lower insulating dielectric layer 35 may be solder mask layers. For example, materials of the upper insulating dielectric layer 34 and the lower insulating dielectric layer 35 may be green paint.

The first interconnection region 31 of the second base plate 30 has a plurality of second connection pads 311. An area of the second connection pad 311 is greater than or equal to an area of the first connection pad 171.

By setting the area of the second connection pad 311 to a larger area, a contact area when the second package is in contact with the second connection pad 311 can be enlarged. If the contact area is relatively small, it is very difficult to dismount after soldering, so that follow-up disassembly and reassembly can be realized by enlarging the contact area.

In an embodiment, the second interconnection region 32 of the second base plate 30 has a plurality of third connection pads 321. An area of the third connection pad 321 is less than the area of the second connection pad 311.

The number of the third connection pads 321 is greater than the number of the second connection pads 311.

Since the second connection pad is required to be mated and connected to the second package subsequently, the layout design is relatively fixed. The third connection pad carries the interconnection between the second package and the first base plate, so that the layout design is more flexible. By designing the third connection pad to have a large number and a smaller area, the signal transmission efficiency can be enhanced.

In an embodiment, the base 33 of the second base plate 30 has an electromagnetic shielding layer (not shown). By disposing the electromagnetic shielding layer in the base of the second base plate, information interference between the second package and the first semiconductor structure can be prevented from affecting the operation of devices.

Continuously referring to FIG. 8D, after the second base plate 30 is formed; the first semiconductor structure 20 is electrically connected to the second base plate 30 and the first base plate 10 by means of wire bonding.

The first signal transmission region 11 and the second signal transmission region 12 are located at two opposite sides of the first base plate 10. The first semiconductor structure 20 has a first connection end 201. The first connection end 201 and the first signal transmission region 11 are located at the same side and connected to each other by using a lead wire 50. The second interconnection region 32 and the second signal transmission region 12 are located at the same side and connected to each other by using a lead wire 50.

In some other embodiments, the first semiconductor structure 20 and the second base plate 30 are electrically connected to the first base plate 10 by means of TSV interconnection.

As shown in FIG. 5, the first semiconductor chip 21 includes a first chip connection pad 212 and a second chip connection pad 213 that are respectively located on the upper surface and the lower surface, and a first channel 211 that penetrates the first semiconductor chip 21 and connects the first chip connection pad 212 and the second chip connection pad 213. The first channel 211 includes a TSV.

Electric connections between two adjacent ones of the first semiconductor chips 21 and between the first semiconductor structure 20 and the first base plate 10 are achieved by means of the first chip connection pad 212, the second chip connection pad 213, the first channel 211 and a first solder ball 214.

As shown in FIG. 6, the second base plate 30 further includes a second interconnection surface 302 located on the other surface of the base 33. The base 33 has a channel 36 that connects the first interconnection region 31 and the second interconnection surface 302. The first interconnection region 31 is connected to the second signal transmission region 12 by means of the channel 36 in the direction perpendicular to the first base plate 10.

The second base plate 30 includes a second connection pad 311 located in the first interconnection region 31, a fifth connection pad 37 located at the second interconnection surface 302 of the second base plate 30, and the channel 36 that penetrates the base 33 and connects the second connection pad 311 and the fifth connection pad 37. The channel 36 includes a TSV. Also, there is a second solder ball 38 between the second base plate 30 and the first base plate 10.

The second base plate 30 is electrically connected to the first base plate 10 by means of the second connection pad 311, the channel 36, the fifth connection pad 37 and the second solder ball 38.

Figure 8E:
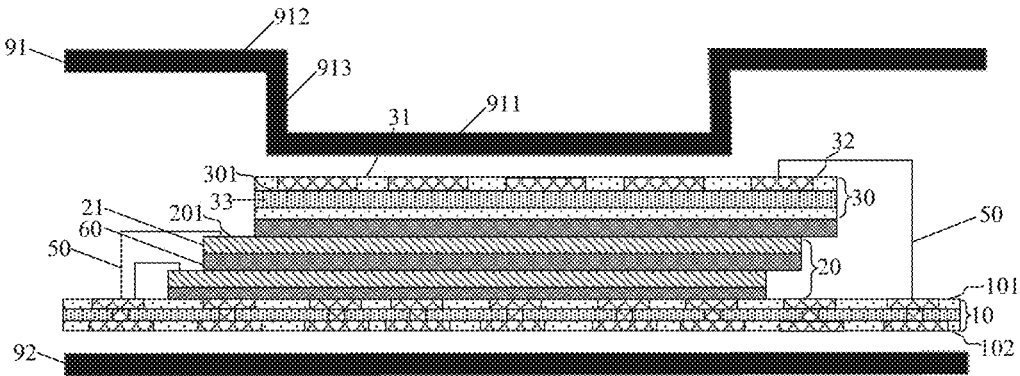
FIG. 8E is a fifth schematic structural diagram of a semiconductor package during manufacturing according to an embodiment of the disclosure.
Figure 8F:
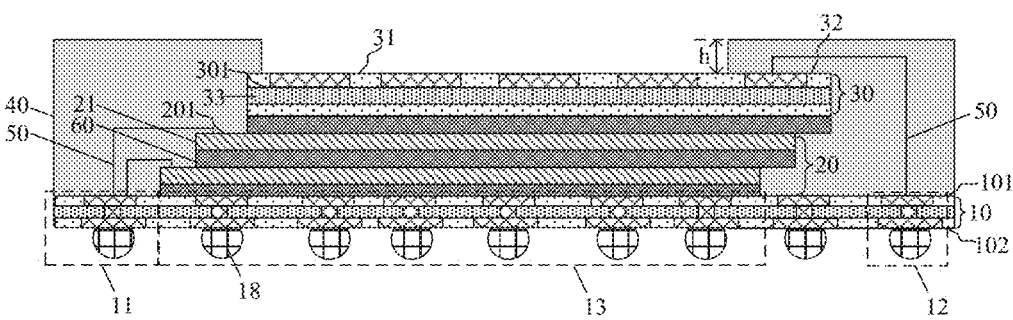
FIG. 8F is a sixth schematic structural diagram of a semiconductor package during manufacturing according to an embodiment of the disclosure.

Next, referring to FIG. 8E and FIG. 8F, S704 of forming the filling layer 40 is executed. The filling layer 40 seals the first semiconductor structure 20, the second base plate 30 and the first surface 101 of the first base plate 10. The first interconnection region 31 is not sealed by the filling layer 40, and the second interconnection region 32 is sealed by the filling layer 40. There is a preset height h between a top surface of the filling layer 40 on the second interconnection region 32 and the first interconnection region 31.

Specifically, referring to FIG. 8E first, a first packaging mold 91 is formed. The first packaging mold 91 includes a first portion 911 and second portions 912 located on two sides of the first portion 911, and a third portions 913 that connect the first portion 911 and the second portions 912. A surface of the second portion 912 is higher than a surface of the first portion 911. The surface of the second portion 912 and the surface of the first portion 911 are both parallel to a surface of the base plate 10. The first portion 911 is located on the first interconnection region 31 of the second base plate 30.

The method further includes forming a second packaging mold 92. The second packaging mold 92 is located below the first base plate 10 and is parallel to the surface of the first base plate 10.

Next, referring to FIG. 8F, by taking the first packaging mold 91 and the second packaging mold 92 as masks, a filling layer 40 is formed. After the filling layer 40 is formed, the method further includes removing the first packaging mold 91 and the second packaging mold 92, so as to expose the first interconnection region 31 that is covered by the first portion 911.

Continuously referring to FIG. 8F, after the filling layer 40 is formed, a second contact structure 18 protruding the first base plate 10 is formed on the first connection pad 171 of the first base plate 10. The second contact structure 18 includes a conductive material.

Figure 8G:
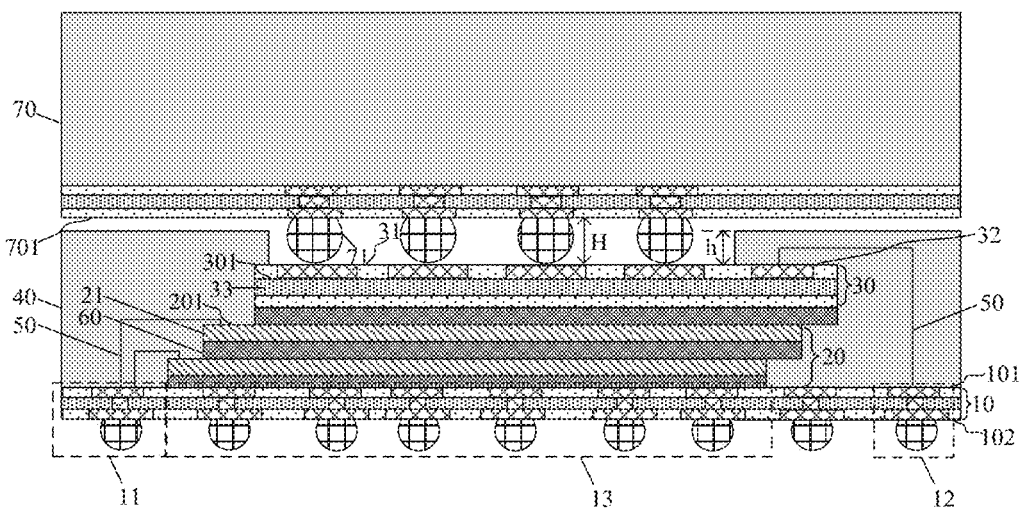
FIG. 8G is a seventh schematic structural diagram of a semiconductor package during manufacturing according to an embodiment of the disclosure.

Next, referring to FIG. 8G, a second package 70 is formed. The second package 70 has a contact surface 701. The second package 70 is connected to the first interconnection region 31 by means of the contact surface 701.

The contact surface 701 of the second package 70 has a first contact structure 71. The first contact structure 71 has, in a direction perpendicular to the contact surface 701, a first height H protruding from the contact surface 701. The first height H is greater than the preset height h.

In an embodiment, the second contact structure 18 on the first base plate 10 has, in a direction perpendicular to the first base plate 10, a second height protruding from the first base plate 10. The second height is less than or equal to the first height.

In an embodiment, the second package 70 includes a second semiconductor structure (not shown). The type of the second semiconductor structure is the same as or different from the type of the first semiconductor structure 20.

The above are only preferred embodiments of the disclosure, and are not used to limit the scope of protection of the disclosure. Any modifications, equivalent replacements and improvements and the like made within the spirit and principle of the disclosure shall be included within the scope of protection of the disclosure.

What is claimed is:

1. A semiconductor package, comprising:
a first base plate, having a first surface, wherein the first surface comprises a first signal transmission region and a second signal transmission region, the first signal transmission region and the second signal transmission region are located at two opposite sides of the first base plate;
a first semiconductor structure, located on the first surface of the first base plate and has a first connection end, the first connection end and the first signal transmission region are located at a same side and connected to each other by using a lead wire;
a second base plate, located on the first base plate and comprising a base and a first interconnection surface located on the base, wherein the first interconnection surface of the second base plate is away from the first surface of the first base plate, the first interconnection surface has a first interconnection region and a second interconnection region that communicate with each other, the second interconnection region and the second signal transmission region are located at a same side and connected to each other by using a lead wire; and
a filling layer, sealing the first semiconductor structure, the second base plate and the first surface of the first base plate, wherein the first interconnection region is not sealed by the filling layer, the second interconnection region is sealed by the filling layer, and there is a preset height between a top surface of the filling layer on the second interconnection region and the first interconnection region.

2. The semiconductor package of claim 1, wherein the first surface of the first base plate further comprises a third signal transmission region located between the first signal transmission region and the second signal transmission region; and the first semiconductor structure is located on the third signal transmission region.

3. The semiconductor package of claim 2, wherein the first surface of the first base plate further comprises a fourth signal transmission region; the second base plate is located on the fourth signal transmission region; and the second signal transmission region is electrically connected to the fourth signal transmission region.

4. The semiconductor package of claim 2, wherein the second base plate is located on the first semiconductor structure; the first interconnection region is electrically connected to the second signal transmission region by means of the second interconnection region; the third signal transmission region comprises a first signal sub-region and a second signal sub-region; the first signal sub-region is connected to the first signal transmission region and located in a close region of the first signal transmission region; and the second signal sub-region is connected to the second signal transmission region and located in a close region of the second signal transmission region.

5. The semiconductor package of claim 3, wherein the fourth signal transmission region is electrically connected to the first interconnection region.

6. The semiconductor package of claim 2, wherein the first semiconductor structure is connected to the first signal transmission region in a direction perpendicular to the first base plate.

7. The semiconductor package of claim 6, wherein the first semiconductor structure is connected to the third signal transmission region in the direction perpendicular to the first base plate; and the first signal transmission region is connected to the third signal transmission region.

8. The semiconductor package of claim 3, wherein the second base plate further comprises a second interconnection surface located on an other surface of the base; the base has a channel that connects the first interconnection region and the second interconnection surface; and the first interconnection region is connected to the second signal transmission region by means of the channel in a direction perpendicular to the first base plate.

9. The semiconductor package of claim 1, wherein the base of the second base plate has an electromagnetic shielding layer.

10. The semiconductor package of claim 4, wherein there is an electromagnetic shielding structure between the first signal sub-region of the first base plate and the second signal sub-region.

11. The semiconductor package of claim 1, wherein the first base plate has a second surface facing away from the first surface; there is a circuit channel between the first surface and the second surface; the second surface of the first base plate has a plurality of first connection pads; and wherein the first interconnection region of the second base plate has a plurality of second connection pads; and an area of a second connection pad is greater than or equal to an area of a first connection pad.

12. The semiconductor package of claim 11, wherein the second interconnection region of the second base plate has a plurality of third connection pads; and an area of a third connection pad is less than the area of the second connection pad.

13. The semiconductor package of claim 11, wherein the first signal transmission region of the first base plate has a plurality of fourth connection pads; and an area of a fourth connection pad is less than or equal to the area of the first connection pad.

14. The semiconductor package of claim 12, wherein a number of the third connection pads is greater than a number of the second connection pads.

15. The semiconductor package of claim 1, wherein in a direction perpendicular to the first base plate, the first base plate has a first thickness; in a direction perpendicular to the second base plate, the second base plate has a second thickness; and the first thickness is less than the second thickness.

16. The semiconductor package of claim 1, further comprising a second package, wherein the second package has a contact surface; and the second package is connected to the first interconnection region by means of the contact surface.

17. The semiconductor package of claim 16, wherein the contact surface of the second package has a first contact structure; the first contact structure has, in a direction perpendicular to the contact surface, a first height protruding from the contact surface; and the first height is greater than the preset height.

18. The semiconductor package of claim 17, wherein a first connection pad of the first base plate has a second contact structure protruding from the first base plate; the second contact structure has, in a direction perpendicular to the first base plate, a second height protruding from the first base plate; and the second height is less than or equal to the first height.

19. The semiconductor package of claim 16, wherein the second package comprises a second semiconductor structure; and a type of the second semiconductor structure is same as or different from a type of the first semiconductor structure.

* * * * *